(12) United States Patent
Zhou (10) Patent No.: US 8,564,429 B2
(45) Date of Patent: Oct. 22, 2013

(54) DUAL TIRE PRESSURE MONITOR WITH EQUALIZER APPARATUS AND TIRE INFLATION SYSTEM INTEGRATION

(76) Inventor: Joe Huayue Zhou, Hacienda Heights, CA (US)

(*) Notice: Subject to any disclaimer, the term of this patent is extended or adjusted under 35 U.S.C. 154(b) by 397 days.

(21) Appl. No.: 13/035,997

(22) Filed: Feb. 27, 2011

(65) Prior Publication Data

US 2012/0218095 A1    Aug. 30, 2012

(51) Int. Cl.
*B60C 23/00* (2006.01)
*G06F 11/10* (2006.01)
*H03M 13/09* (2006.01)

(52) U.S. Cl.
USPC .......... 340/447; 340/442; 340/445; 73/146.4; 73/146.5

(58) Field of Classification Search
USPC .......................................................... 340/447
See application file for complete search history.

(56) References Cited

U.S. PATENT DOCUMENTS

| 5,838,750 | A  | * | 11/1998 | Rynaski et al. | 375/377 |
| 6,441,728 | B1 | * | 8/2002  | Dixit et al.   | 340/447 |
| 6,473,875 | B1 | * | 10/2002 | Anderson       | 714/746 |
| 6,543,279 | B1 | * | 4/2003  | Yones et al.   | 73/146.5 |
| 2007/0194896 | A1 | * | 8/2007 | Ehrlich et al. | 340/447 |

* cited by examiner

*Primary Examiner* — Donnie Crosland (57) ABSTRACT

A wireless dual tire pressure monitor and equalizer apparatus is adapted to install on a vehicle dual wheel and connect to the two tire valve stems. The apparatus includes capabilities of monitoring individual tire pressure and transmitting tire data to be received by a remote receiver, equalizing pressure in the two tires when pressure is above a selected level, isolating the two tires when pressure is below the selected level, and transmitting warning signals upon detection of low pressure and air leaks. The apparatus further includes capability to integrate with available tire inflation systems for providing tire pressure monitoring and equalizing functionalities.

11 Claims, 10 Drawing Sheets

System Design of the Dual Tire Pressure Sensor with Equalizer Integrated to with Trailer tire Inflation System.

Figure 1

Dual Tire Pressure Sensor

With Equalizer Module Assembly Drawing

Figure 2  Dual Tire Pressure Sensor
With Equalizer Half-Section View

Figure 3 Pressure Equalizer Sectional View

Figure 4 Dual Pressure Sensor Mounting Oblique View

Figure 5

Dual Tire Pressure Sensor PCB and Replaceable Battery Assembly Drawing

Figure 6

Dual Tire Pressure Sensor and Equalizer with Wheel mounting Bracket

Figure 7   Dual Tire Pressure Sensor with Equalizer Installation on Dual Wheel

Figure 8

Wheel Mounted Dual Tire Pressure Sensor with Equalizer
Integrated to Tire Inflation System

Figure 9

Schematic of the Dual Tires Pressure Sensor Electronic Circuitry

Figure 10

System Design of the Dual Tire Pressure Sensor with Equalizer Integrated to with Trailer tire Inflation System.

DUAL TIRE PRESSURE MONITOR WITH EQUALIZER APPARATUS AND TIRE INFLATION SYSTEM INTEGRATION

FIELD OF THE INVENTION

The invention relates to the field of dual tire pressure monitoring with pressure equalizing feature. Particularly, the invention relates to a miniature external wheel mounted apparatus with built-in tire pressure monitoring circuitry and dual tire equalizer having one valve stem for air intake plus two air outlet valve stems for connecting to the dual tires, that the apparatus allows refilling tire air through one valve stem to the two tires, and the built-in pressure sensors can monitor individual tire of the dual tire pressure in real time and transmit the tire information to a remote device by wireless means, that the built-in dual tire equalizer can balance the dual tire pressure in normal operating condition, and can isolate the two tires when pressure dropped below a certain level, and methods for constructing and operating the apparatus. The invention further relates to integrating the dual tire pressure monitor with equalizer to tire inflation systems.

BACKGROUND OF THE INVENTION

In commercial and off-the-road vehicles, wheel assemblies having dual pneumatic tires are commonly used, with typically a set of dual tires mounted on each end of an axle. During normal operation of such a vehicle the air pressure in the dual tires may not be equal. This can be caused by improper inflation, uneven heating of the tires, or an air leak in either tire. Correct and properly balanced pressure in the dual tires will help to provide even wear and longer life of the expensive tires. Numerous innovations for equalizing dual tire pressure have been provided in prior arts but few covered dual tire pressure monitoring. Some innovations are related to dual tires equalizer with a simple mechanical pressure indicator. For direct pressure monitoring, electronic pressure sensors have long been used to monitor tires for determining whether the tire was properly pressurized. However most related prior inventions for tire pressure sensors were for single tire pressure monitoring only. Numerous innovations for inflating dual tires also have been provided but few covered controlling tire inflation with real-time dual tire pressure measurements.

U.S. Pat. No. 4,539,928 issued to Gordon R. Todhunter on Sep. 10, 1985 discloses a tire equalizer device that comprises a housing having upper and lower chambers divided by a flexible diaphragm opposing a seat in the upper chamber connected to one of the tires. The diaphragm is urged toward the seat by a spring-pressed inverted cup larger in diameter than the diaphragm and having an arm extended longitudinally from the cup away from the spring. The arm is curved in horizontal cross-section and its upper end is formed with a slot receiving an off-center pin on the back of an indicator disc. Also connected to the upper chamber is a fill conduit, and a conduit to the other tire.

U.S. Pat. No. 5,302,939 issued to Edward A. Downs on Apr. 12, 1994 discloses a dual tire equalizer having a diaphragm that pushes a spring-loaded rod between two switch devices which, when the tire is not properly pressurized, will trigger the sending of an encoded RF signal to a receiver for generating alarms.

U.S. Pat. No. 5,302,939 issued to Edward A. Downs on Apr. 12, 1994 discloses a method and apparatus for maintaining equal air pressure in a dual tire. The invention provides a valve body with a pair of piston chambers.

U.S. Pat. No. 7,656,281 issued to Joe Huayue Zhou on Feb. 2, 2010 discloses an external valve stem mounted tire pressure monitoring sensor with air flow through feature. Particularly, the invention relates to an apparatus of a miniature external valve stem mounted tire pressure sensor design that allows refilling tire air through the sensor built-in valve stem without needing to remove the sensor, and methods for constructing and operating the apparatus.

Typically, these systems teach equalizing dual tires without continuous pressure monitoring and remote notification, or only do tire pressure monitoring without dual tire equalizing. Furthermore, these teachings do not address or not able to resolve many practical issues, as described below:

(i) Dual Tire Pressure Monitor with Equalizer Function

Properly pressurized and equalized tires in a dual tire set are utmost important for safe driving and for prolonging the life of tires. However prior tire pressure monitoring systems (TPMS) generally only monitor tires without pressure equalization and, therefore, can only be used as a separate system to support tire monitoring for the dual tire pressure equalizing systems. It is technically challenging to make a small, integrated dual tire pressure monitor with equalizer that can monitor individual tire pressure in a dual tire set, refill air without removing the sensor, and equalize the pressure in the two tires. Prior teachings generally do not present practical methods to make small external dual tire sensors with pressure equalizer.

(ii) Dual Tire Pressure Monitor with Equalizer and Tire Inflation System Integration There are many tire inflating systems available on the market and most of them are designed for trailer installation. Such systems use compressed air from the trailer air tank to inflate tires having pressure that fell below a preset level. Air from the existing trailer air supply is routed to a control box and then fed into air tubes installed inside each axle. The air tubes run through the axles to carry air through a rotary union assembly joined at the wheel spindle end in order to distribute air to each tire.

Although good tires usually able to keep proper pressure for weeks, a tire inflation system on a vehicle often must operate every trip due to possible air line and seal leaks. In addition, tire inflation systems generally do not have direct pressure readings from the dual tires for controlling the inflation and, therefore, must inflate from time to time and check if the preset pressure was maintained on the air line. If pressure was still low after a period of time then the systems would deduce that there might be a leaky or flat tire. This indirect detection of air leak and flat tire is unreliable and usually belated, and the excessive work load putting on the rotary hub seal unit and the air compressor will wear out the parts sooner and would lead to more expensive vehicle maintenance and even unsafe driving conditions. A tire inflation system integrated with tire pressure monitor and equalizer would have accurate inflation control based on real-time tire pressure data and, as a result, works less and thereby reduces the vehicle maintenance costs; most importantly such an integrated system improves vehicle safety for it would be able to notify the driver low or flat tire condition immediately.

A tire inflation system integrated with a direct tire pressure monitor, even without the pressure equalizing function, can also provide substantial benefits in accurate inflation control, improved vehicle safety, and system maintenance cost reductions.

SUMMARY OF THE INVENTION

A main object of the present invention is to provide a miniature dual tire pressure monitoring sensor with dual tire equalizer feature, which can be easily mounted on the vehicle dual wheel and connected to the tires.

Another object of the invention is to provide a dual tire pressure monitoring system with miniature dual tire sensors that can be easily mounted on the outside dual wheel and connected to the tires, for applications not needing tire pressure equalization.

Another object of the invention is a method for the dual tire pressure monitor with equalizer to integrate with trailer dual tire inflation systems.

Another object of the invention is a method for manually triggering pressure sensor signal transmission by applying a magnetic field near the tire sensor. It provides a simple and reliable sensor signal triggering method for tire monitoring system programming and services.

Another object of the invention is a method for manually triggering pressure sensor signal transmission by applying a Low Frequency (LF) wireless signal near the tire sensor. It provides a simple and reliable sensor signal triggering method for tire monitoring system programming and services.

Another object of the invention is a method for pressure sensor battery replacement.

Another object of the invention is a method for a tire pressure monitor to integrate with trailer tire inflation systems.

DETAILED DESCRIPTION OF THE INVENTION

An embodiment of the invention is described herein with references to the figures using reference designations as shown in the figures.

Figure 1:
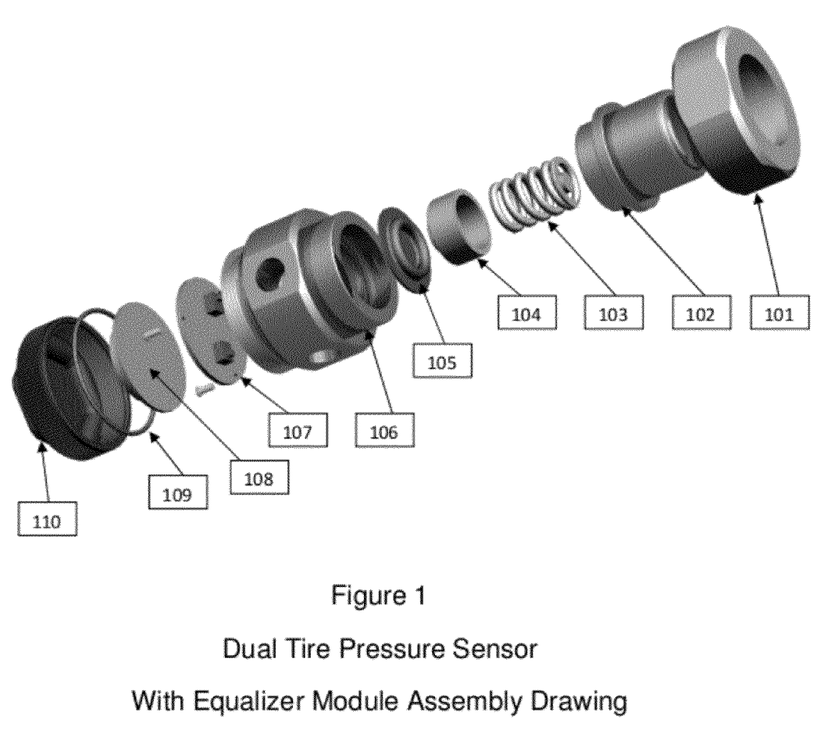
FIG. 1 is an assembly drawing of the dual tire pressure sensor with equalizer module.

FIG. 1 shows the assembly of the dual tire pressure sensor with equalizer module, where 101 is a lock ring with threads screwing onto a rigid module body 106 to secure a spring holder cap 102 that contains a spring 103, an inverted cylindrical cup 104 and a diaphragm 105. On the other side of the module body where 107 is the dual sensor electronic PCB, 108 is the replaceable battery PCB with battery holder, 109 is a waterproof sealing o-ring and 110 is the battery cap with threads.

Figure 2:
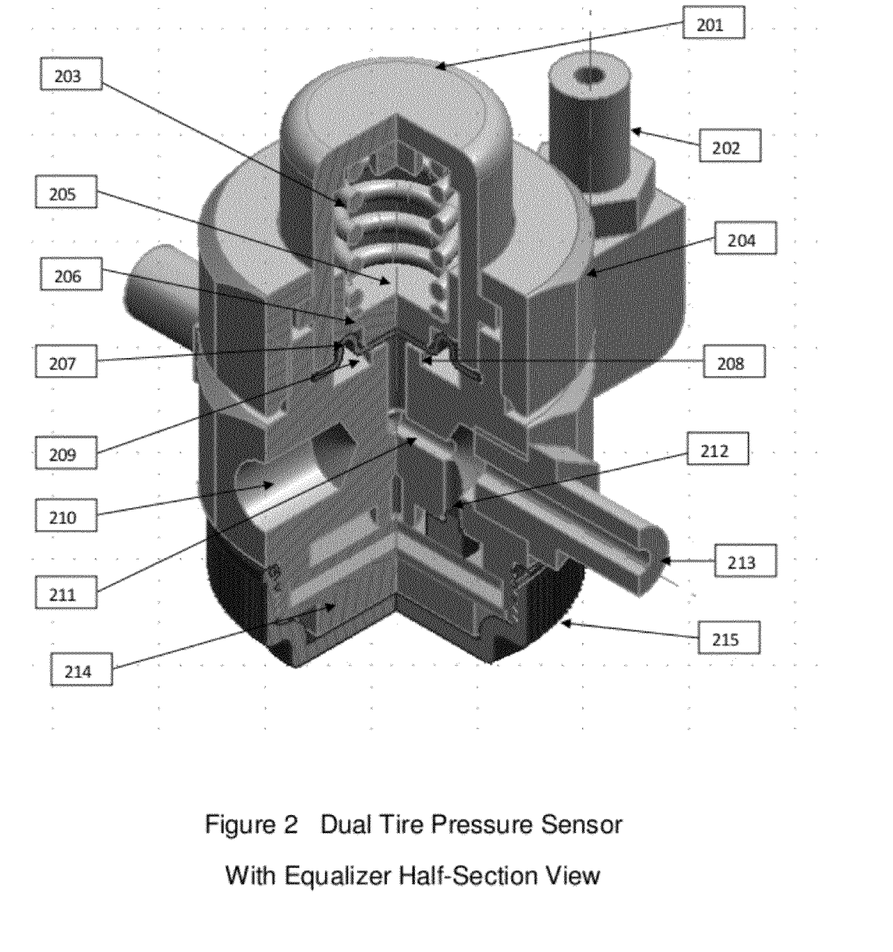
FIG. 2 is a drawing of the dual tire pressure sensor with equalizer half-section view.

FIG. 2 shows a half-section drawing of the dual tire sensor with equalizer module. Referring to FIG. 2, the assembly comprises a rigid module body 204 with the upper portion having a spring holder cap 201 holding a spring 203 that extended downward to bear on an inverted cylindrical cup 206 and a diaphragm 207 beneath; the space formed above diaphragm 207 and enclosed by cap 201 defines an upper chamber 205. Enclosed by the module body shell, the recess beneath diaphragm 207 defines a lower chamber 209 with a seat 208; the lower chamber 209 has a passage communicating to the air inlet valve stem 202. Centrally diaphragm 207 is able to engage the seat 208 underneath, which at its center has an opening with air passage 211 leading to a pressure sensor air hole 212 and an air outlet 213; another pressure sensor hole and air outlet are showed in FIG. 3. A threaded hole 210 on the module body supports fastening the module on a bracket for mounting on a dual wheel. On the bottom portion of the module are the pressure sensor battery 214 and the battery cap 215.

Figure 3:
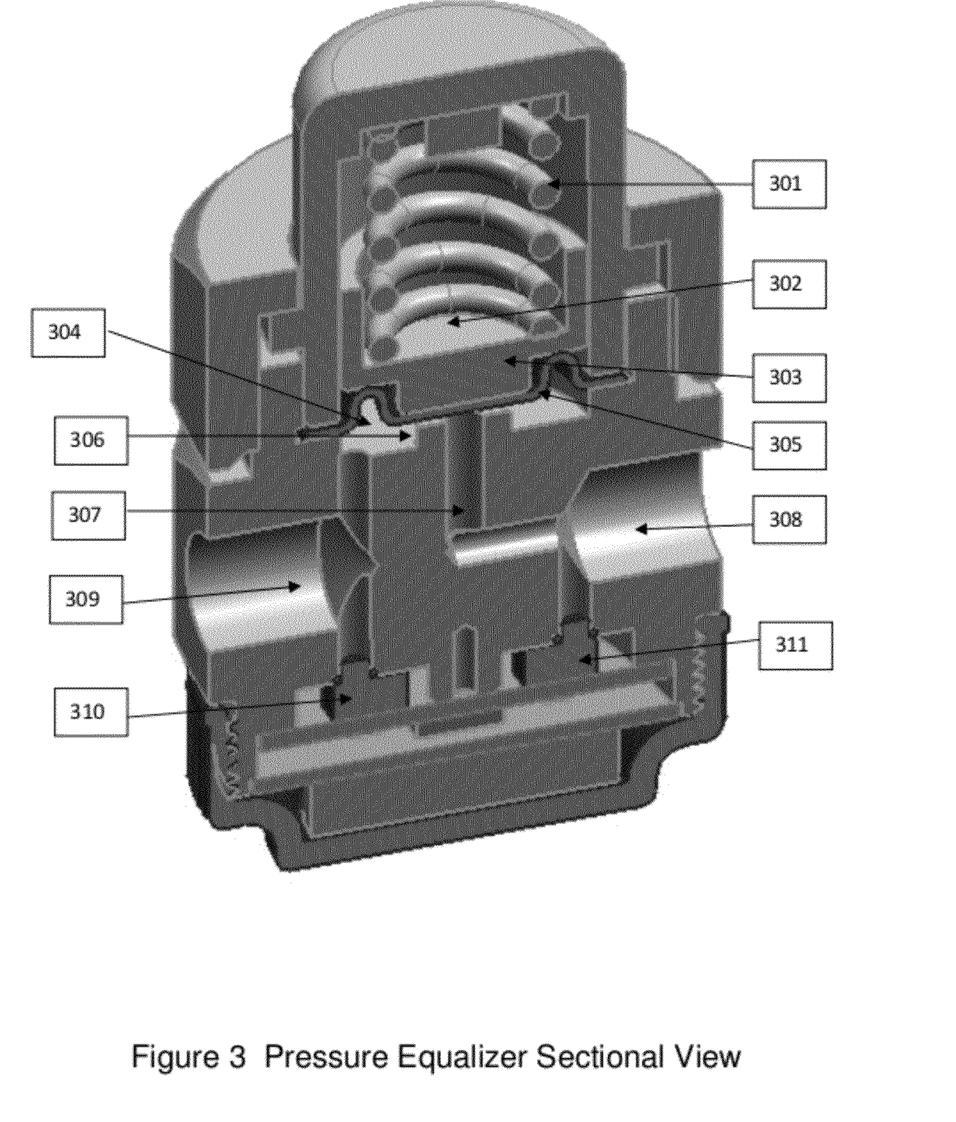
FIG. 3 is a drawing of the pressure equalizer sectional view.

FIG. 3 shows a sectional view of the dual sensor with equalizer module. In the drawing diaphragm 305 separates lower chamber 304 from upper chamber 302 that contains spring 301 and inverted cylindrical cup 303. Lower chamber 304 has passages communicate respectively with an air inlet (showed in FIG. 2), an air outlet 309 for one tire, and a pressure sensor 310. When diaphragm 305 is not engaged with seat 306, the lower chamber 304 also communicates through passage 307 with opening at the center of seat 306 to air outlet 308 for the other tire, and to another pressure sensor 311.

By virtue of the dual sensor with equalizer module structure described thus far, sufficient air pressure in the lower chamber will urge the diaphragm 305 and cup 303 assembly upward and away from seat 306 against the downward force of spring 301, permitting the two tires to communicate; this equalizes the pressure in the dual tires. A drop in pressure will allow spring 301 to drive the cup 303 and diaphragm 305 downward to engage the seat 306 and close off communication between the two tires.

Figure 4:
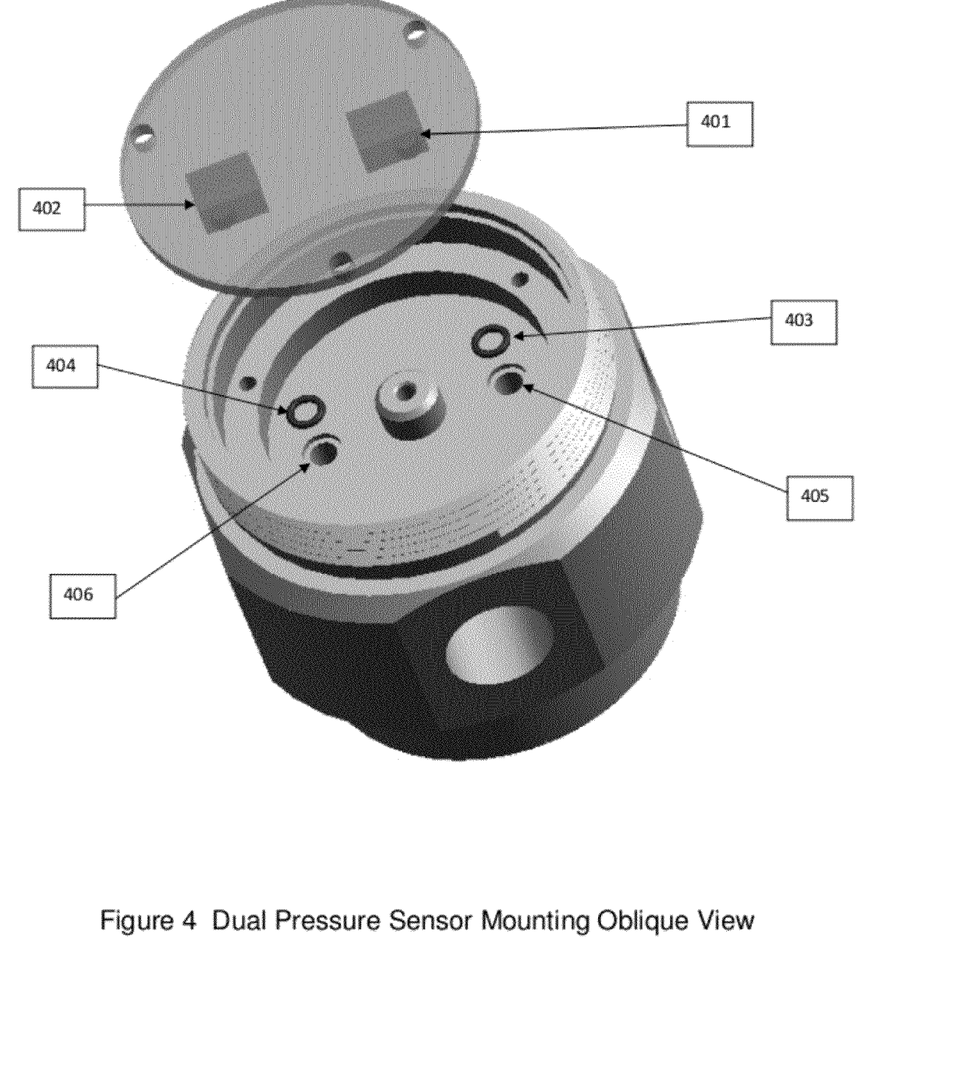
FIG. 4 is a drawing of the dual pressure sensor mounting oblique view.

FIG. 4 shows an oblique view drawing of the dual tire pressure sensor assembly, where two port type piezo-resistive pressure sensors 401 and 402 are mounted on the underside of a print circuit board for mating respectively to air holes 405 and 406 that communicate to respective air outlets 308 and 309; o-rings 403 and 404 support the sensor to air hole mating for forming an airtight sealing.

Figure 5:
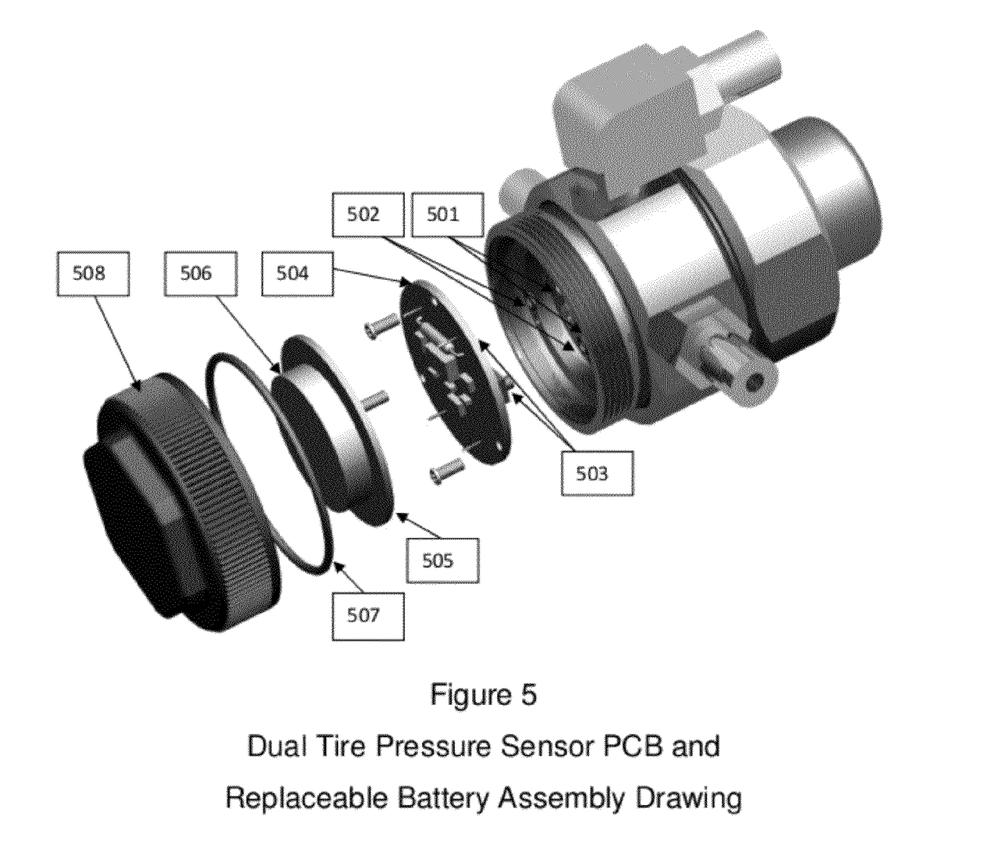
FIG. 5 is an assembly drawing showing the dual tire pressure sensor PCB and a replaceable battery.

FIG. 5 shows an assembly drawing of the dual tire pressure Sensor PCB and replaceable battery. PCB 504 with pressure sensors 503 is installed onto air holes 501 with o-rings 502 the same way as earlier FIG. 4 descriptions, and secured by set screws onto the module body. PCB 505 is stacked on PCB 504 to provide power supply with a replaceable battery 506, which is mounted on the backside of PCB 505 and encapsulated by a threaded cap 508 with a waterproof sealing o-ring 507. To protect the delicate and sensitive electronics after mounting, epoxy compounds can be used to fill up the spaces underneath PCB 504 and 505. Through the air holes the two sensors are directly exposed to air pressure of the respective tire. When the two tires are communicating, that is, when diaphragm 305 is not engaged with seat 306, both sensors will be measuring the pressure from the same source. However when lowering pressure caused diaphragm 305 to engage with seat 306 and close off tire communication, then each sensor will be reading the pressure of its own tire.

Figure 6:
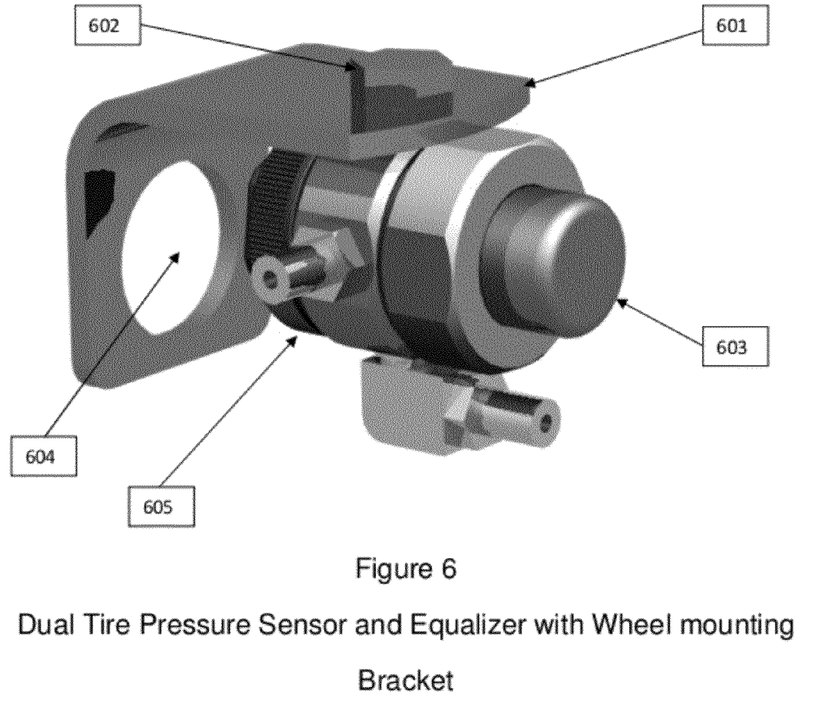
FIG. 6 is a drawing of dual tire pressure sensor and equalizer with wheel mounting bracket.

FIG. 6 shows the dual tire pressure sensor and equalizer module 603 fasten on a bracket 601, where mounting bolt 602 with a lock washer is inserted through a hole in bracket 601 and screwed into the threaded hole 210 in the module body. A large hole 604 in bracket 601 allows mounting the dual tire pressure sensor and equalizer module on a dual wheel. When fastening to bracket 601, battery cap 605 of module 603 is oriented toward hole 604, so that after mounting on the wheel the module electronics portion would be facing the wheel and therefore would have a less chance of being damaged by possible flying debris on the road.

Figure 7:
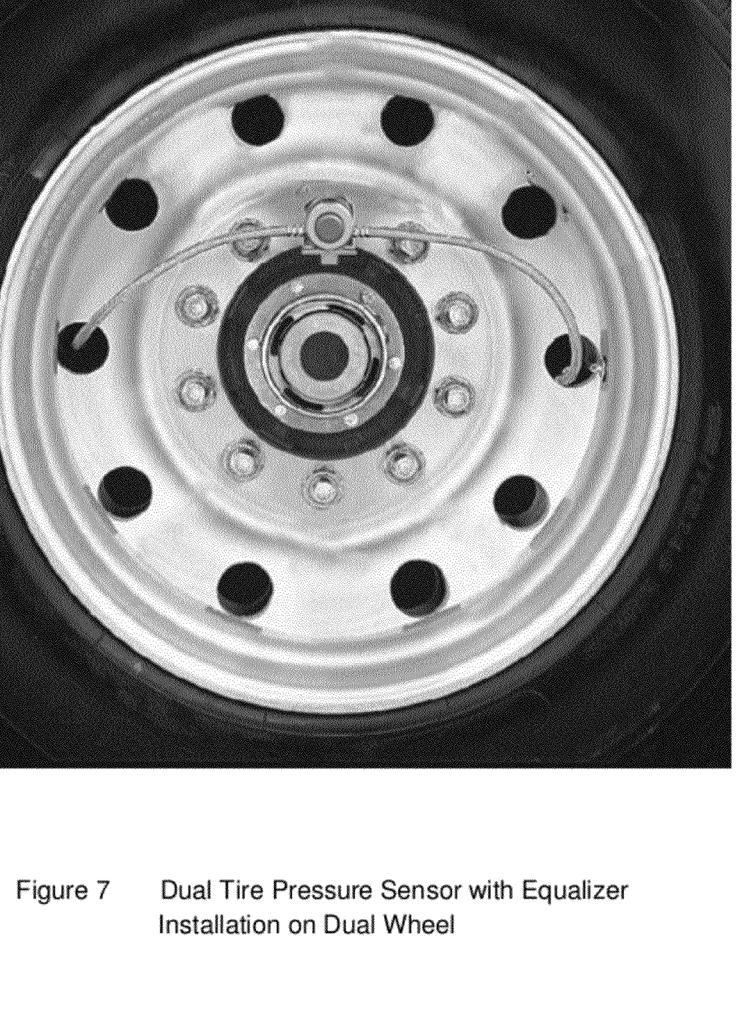
FIG. 7 shows the dual tire pressure sensor with equalizer installation on dual wheel.

FIG. 7 shows the dual tire pressure sensor with equalizer module installation on a dual wheel, where a bracket and module assembly is mounted on one of the wheel bolts or studs with two hoses each connecting one of the two module air outlets to respective inner and outer tire valve stems. Tire air can easily be filled through the module air inlet valve stem and the dual tire pressure can be equalized by mechanism inside the module. With a remote cab-mounted RF receiver, the driver can monitor dual tire pressure in real-time.

Figure 8:
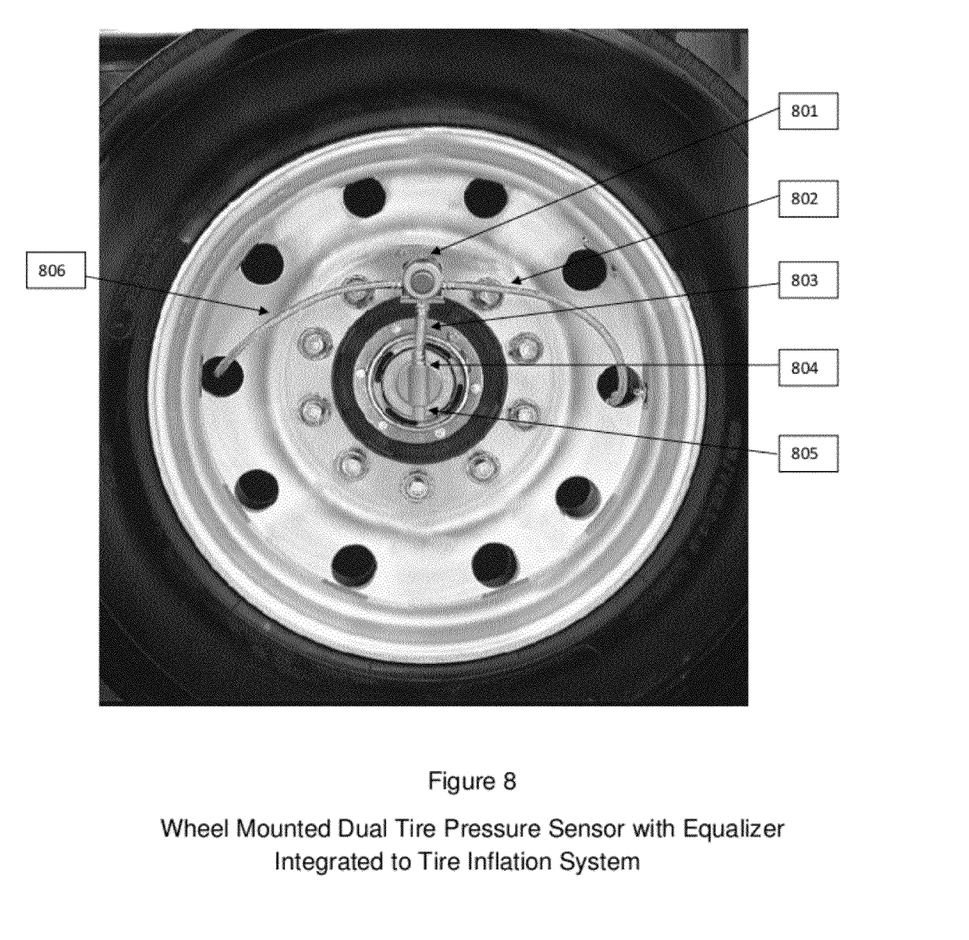
FIG. 8 shows a dual tire pressure sensor with equalizer installation on dual wheel and integrated with an existing tire inflation system.

FIG. 8 shows a wheel mounted dual tire pressure sensor and equalizer module 801 being integrated with an existing tire inflate system, where an air outlet 804 on the flow-through tee of the inflation system is connected by a short hose 803 with an adapter to the dual tire pressure sensor and equalizer module air inlet; the other air outlet 805 of the flow-through tee will be sealed off by a block cap. Hose 802 connects one of the module 801 air outlets to one of the dual tires, and hose 806 connects the other module air out to the second tire. The integrated systems now will have the functionalities of inflating tires, equalizing dual tire pressure, and monitoring tires in real-time.

In operation, the dual tire pressure sensor with equalizer module is installed on a dual wheel as showed in FIG. 7 or FIG. 8, with the two hoses 802 and 806 connecting the two air outlets respectively to the dual tire valve stems. The two tires are then filled through the module air inlet 202. When tires are empty or have low pressure, spring 203 in the module forces cup 206 and diaphragm 207 to move downward and engage seat 208, thereby closes off communication between the two tires. When sufficient air is filled through module air inlet 202 into lower chamber 209 and through an air outlet to one tire, the built up pressure overpowers the force of spring 203 exerted on cup 206 and diaphragm 207 and disengages diaphragm 207 from seat 208, thereby opens up communication between the two tires and permits air flowing into the other tire. When the tires are sufficiently pressurized and not leaking, communication between the two tires will remain open and tire equalization is achieved. When pressure drops to a certain level due to air loss from one or both tires, communication between two tires will be closed off as described earlier. In this case, with a regular tire equalizing system it is possible that a leaky tire might continue losing air to a dangerously low level but the driver would have no knowledge of the imminent safety hazard. With the dual tire pressure sensor and equalizer described herein, however, pressure sensors 310 and 311 in the apparatus will continuously measure the pressure level of the two tires and send the data and any warnings by wireless transmission to a monitor mounted in the driver cab. The driver now can learn of the tire pressure conditions at anytime, receive alerts of tire pressure problems as it happened, and able to take corrective actions accordingly. Current tire inflation systems merely turn on an indicator light to notify the driver when the tires are being inflated, and it is up to driver to deduce the severity of air loss based on how long and how often the inflation has been happening. In contrast, a tire inflation systems integrated with the apparatus described will continuously display the current tire pressure data on the monitor, so that the driver can easily and quickly identify tire pressure related problems indicated by irregular and fluctuating individual tire pressure readings.

Figure 9:
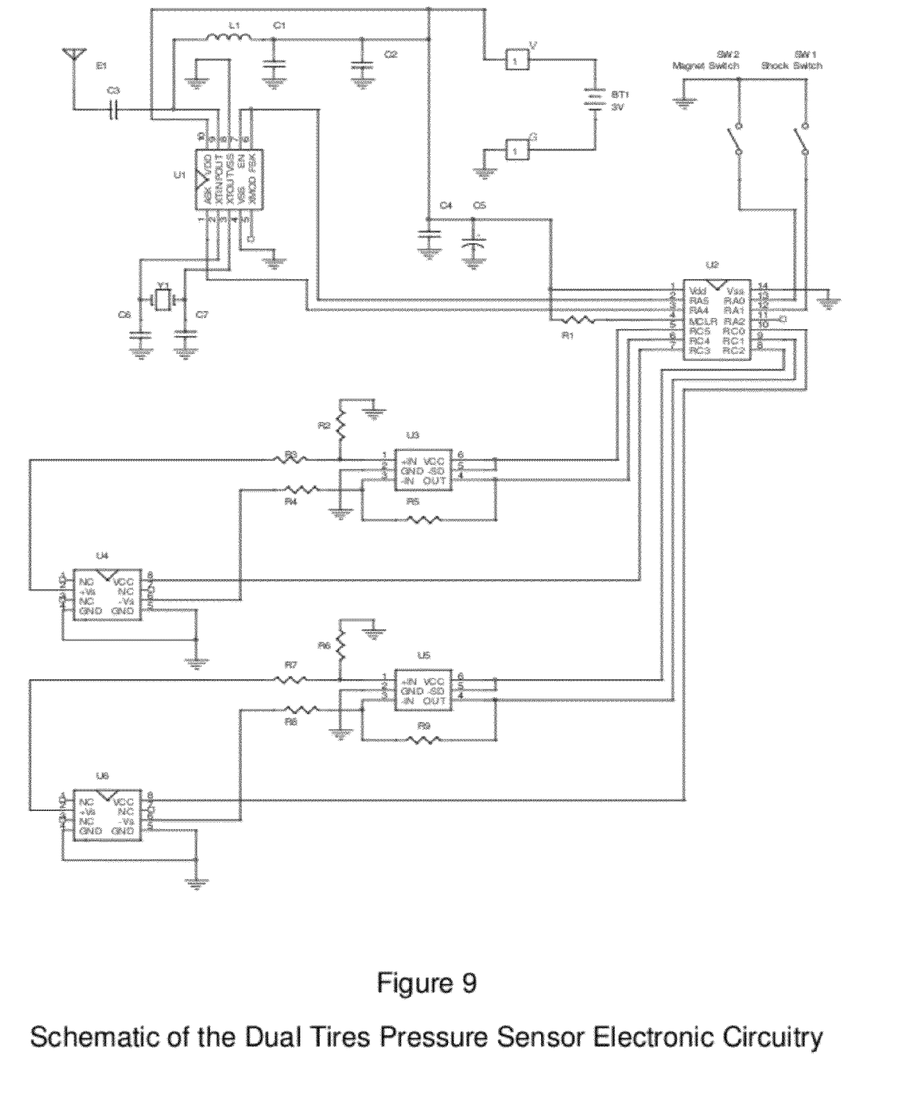
FIG. 9 is a schematic of the dual tire pressure sensor electronic circuitry.

FIG. 9 shows a schematic diagram for the electronic design of the dual tire pressure sensor module sensory logic and RF signal transmitter functions. Sensory electronics include two piezo-resistive pressure sensors U4 and U6, which comprises four strain resistant sensitive resistors diffused in silicon. These resistors are connected in a Whetstone bridge configuration, whereby two resistors increase resistance with positive pressure while the other two resistors decrease in resistance. When pressure is applied to sensors, the resistors in the arms of the bridge of sensors changed resistance by an amount directly proportional to the pressure applied. When a voltage is applied to the bridge, there will be a resulting differential output voltage indicating sensed tire pressure.

Sensory logic further consists two micro-power amplifiers U3 and U5 connected to respective sensor bridge U4 and U6 and supported by resistors R2 through R9, plus a high performance CMOS eight-bit microprocessor U2 with filter capacitors C4 and C5 processes data, controls I/O and manages power. The micro-power amplifiers U3 and U5 condition the sensed tire pressure voltage signal for input to the on-chip A/D converter of microprocessor U2, thereby producing digital readings of the tire pressure sensed by sensor U4 and U6. To reduce component cost, this design utilizes one microprocessor to process inputs from both pressure sensors and then combines the dual tire pressure data to form a single message for RF signal transmission. The radio frequency transmitter consists of a transmitter IC U1, inductor L1, capacitors C1, C2, C3, C6, C7, and a crystal Y1 for providing a transmitter frequency signal at 433.92 MHz or 313 MHz. The transmitter is modulated by microprocessor U2 at pin 3 and enabled at pin 2.

For reducing the circuit size, an internal 4 MHz RC oscillator is used to clock microprocessor U2. Under program control, microprocessor U2 outputs an encoded digital message data string for amplitude shift key modulating the carrier signal from the RF transmitter circuit. To minimize power consumption, the tire pressure sensor module operates in a dormant mode and only wakes up every few seconds and then spends several milliseconds checking the pressure sensors. If there has been a significant pressure change, such as +/−2 PSI, from the previous reading, the sensor module immediately transmits an ASK modulated radio frequency signal with encoded message to the monitor. From time to time the module also sends a "heartbeat" message with the current pressure readings to the monitor. The RF message consists of the sensor module ID, tire air pressure value, temperature value, battery level data, and checksum. To reduce RF signal transmission time for saving power usage, a compact data packing format is developed for sending dual tire pressure data in a message having only 8 data bytes. Usually tire pressure sensor message uses 4 bytes for sensor ID, but the compact format only uses 3 bytes for sensor ID while using one byte for status indication. Half of the status byte, i.e., 4 bits, is used for single or dual tire indication, while the other half byte is for storing sensor status such as low battery, vehicle in motion or stationary, rapid pressure change, and Low Frequency (LF) signal trigger. The remaining data consists of the outer tire pressure byte, inner tire pressure byte, dual tire temperature byte, and the checksum byte. In this arrangement, an 8 byte data format can contain enough information for the dual tire pressure sensor.

Figure 10:
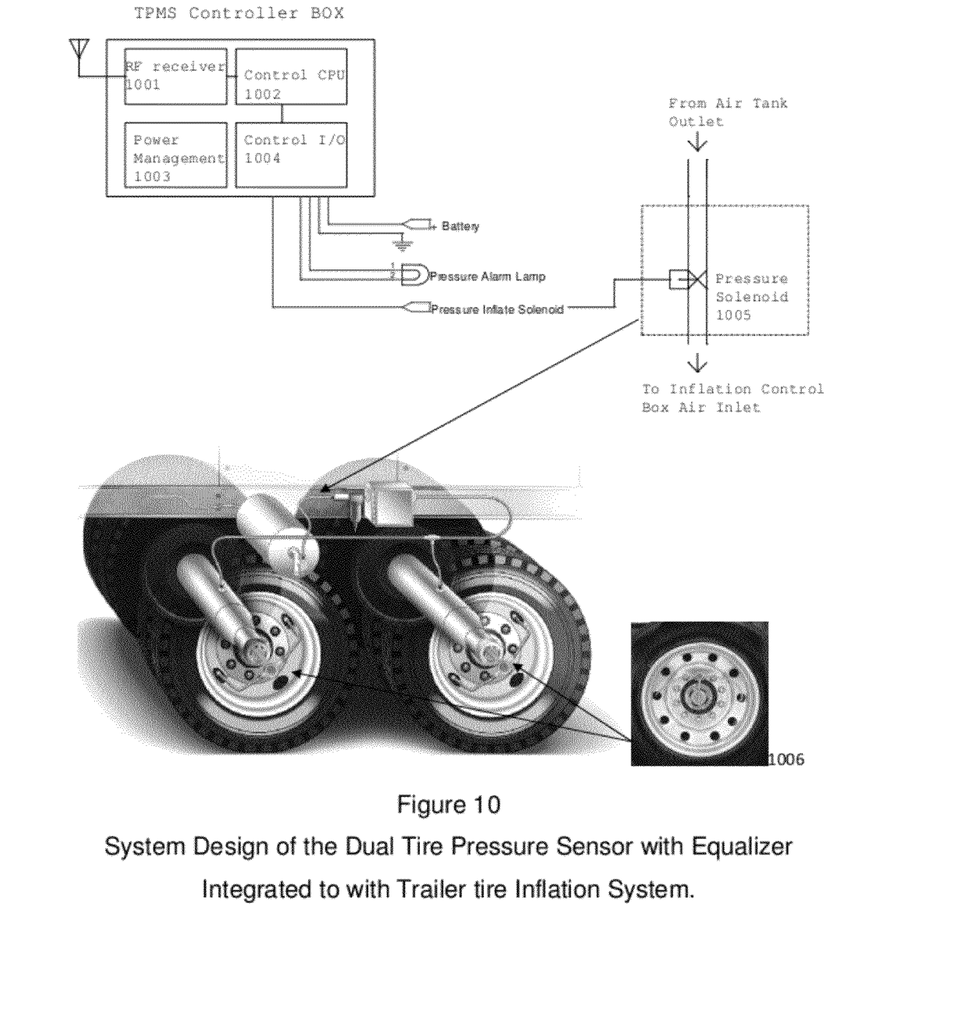
FIG. 10 is a system design of the dual tire pressure sensors with equalizer integrated with a trailer tire inflation system.

Referring to FIG. 10, it is a system design of the dual wheel sensor with equalizer integrated with any tire inflation systems having pipes and hoses supplying air to the tires through the valve stem. The TPMS for integrating with a tire inflation system consists of a dual tire sensor with equalizer for each dual tire set as showed in earlier figures, a TPMS controller box, and an apparatus with an air solenoid valve controllable by the TPMS controller. The TPMS controller box consists of RF receiver 1001, CPU controller 1002, power management 1003 and I/O controller 1004. CPU 1002 processes real time tire pressure data from RF receiver 1001, and the I/O controller 1004 turns on or off the low pressure alarm lamp for notifying the driver. I/O controller 1004 also controls the opening and shutting off of the air solenoid valve 1005.

The dual tire sensor with equalizer is integrated to the tire inflation system air supply outlet to the tires, as showed in 1006 and FIG. 8. The solenoid valve air inlet is now connected to the trailer air tank outlet, and the tire inflation system controller air inlet is re-routed and connected to the solenoid valve air outlet. The weatherproof TPMS controller box can be installed on the trailer chassis, powered by the trailer power supply, and wired to the solenoid valve apparatus. The TPMS controller box receives real time tire pressure data transmitted from the dual tire sensor with equalizer and, based on a preset and configurable desired pressure level, commands the solenoid valve to open for air to pass through when the tire pressure is low or shut off the valve when pressure is normal; the tire inflation system will not operate if the TPMS controller cut off its air supply. The solenoid valve can also be installed inline after the inflation system controller air outlet; the tire inflation system will not operate if the TPMS controller blocked off the air outflow. The solenoid valve is normally open so that tire inflation would not be blocked in case the TPMS controller is not operating.

A tire inflation system integrated with the above presented apparatus having real time tire pressure measurement and inflation control functionalities would be a greatly improved inflation system for tire safety and maintenance, offering continuous tire condition awareness, accurate tire inflation control, pressure equalization, fast response to rapid tire pressure changes, and much reduced operation time resulting to less maintenance cost and longer system life.

The above system and methods describe a preferred embodiment using exemplar devices and methods that are subject to further enhancements, improvement and modifications. However, those enhancements, improvements modifications may nonetheless fall within the spirit and scope of the appended claims.

ADDITIONAL PREFERRED EMBODIMENTS AND SCOPE

The above preferred embodiment illustrated a typical embodiment of the present invention. Although the description above contains much specificity, these should not be construed as limiting the scope of the invention but as merely providing illustrations of some of the presently preferred embodiments of this invention. There are various possibilities with regard to additional embodiments. Thus the scope of the invention should be determined by the following claims and their legal equivalents, rather than by the examples given.

What I claim as my invention is:

1. A tire pressure equalizer and tire pressure monitor for dual tires comprising:
   (A) a housing adapted to be mounted on a dual tire wheel assembly, having:
      (1) a first chamber and a second chamber separated by a sealed diaphragm, having:
         (a) the first chamber having a seat opposite the diaphragm, with a central opening, the diaphragm being adapted to seat and close off the seat,
         (b) first passageway means for communicating the first chamber to one tire,
         (c) second passageway means for communicating the first chamber seat opening and the other tire, and
         (d) fill means communicating with the first chamber;
      (2) a removable rigid cap with a lock ring affixed on the housing for forming the second chamber,
      (3) an inverted cup disposed in the second chamber with the base engaging the diaphragm opposite the seat;
      (4) spring means in the second chamber compressively disposed in between said cap interior end and the cup bottom wall and urging the cup and diaphragm toward seating disposition, whereby permitting said cup and diaphragm driven by said spring moving to seat and isolate the two tires as pressure dropped below a selected pressure, and moving to unseat and open up air communication between the tires when pressure rose above the selected pressure;
      (5) a tire pressure monitor section having:
         (a) first hole means with passage communicating to the first passageway,
         (b) second hole means with passage communicating to the second passageway,
         (c) electronic assembly means having a combination of a control unit, two pressure sensors, radio frequency signal transmitter, antenna, and power supply mounted on a print circuit board, and
         (d) mounting means securing said electronic assembly into tire pressure monitor section with said pressure sensors pressed against respective said hole to form an airtight mating, such that each pressure sensor through said hole adapted to expose directly to air pressure in the respective passageway and associated tire;
   (B) remote radio signal reception means for receiving and displaying tire pressure data and alerts transmitted by said tire pressure monitor.

2. The system of claim 1, further including tire inflation system integration means, comprising a tire inflation airflow control assembly, having:
   (A) solenoid valve means adapted to fit inline on a tire inflation system controller output air delivery line for permitting and shutting off airflow in said air delivery line;
   (B) warning light means installing on driver observable trailer body for alerting low tire pressure condition;
   (C) central control means having in combination:
      (1) wireless signal reception means receiving tire pressure data transmitted by dual tire pressure monitor of claim 1,
      (2) external device interface means interfacing to said solenoid valve and warning light,
      (3) tire inflation airflow control means having,
         (a) low tire pressure processing means determining low tire pressure condition and switching to open said solenoid valve for permitting airflow, and turning on said warning light, and
         (b) normal tire pressure processing means determining normal pressure condition and switching to close said solenoid valve for shutting off airflow, and turning off said warning light.

3. The solenoid valve of claim 2, alternatively adapted to fit inline on the air supply line from a trailer air tank output port to a tire inflation system controller input port.

4. The housing and electronic assembly of claim 1, further including a replaceable battery assembly and a removable covering cap.

5. The electronic assembly of claim 1, further including induced signal generation means to be activated by an external magnet placing near the said electronic assembly.

6. The electronic assembly of claim 1, further including induced signal generation means to be activated by an external Low-Frequency (LF) triggering signal.

7. The electronic assembly of claim 1, further including tire temperature measurement means.

8. The system of claim 1, further comprising apparatus protection means by having the electronic assembly covering portion of the housing adapted to orient toward the wheel for reducing possible damages to the electronics caused by flying debris on the road.

9. A tire pressure monitor for dual tires comprising:
(A) a tire monitoring module housing adapted to be mounted on a dual tire wheel assembly, having:
  (1) first passage means establishing air communication with one tire,
  (2) second passage means establishing air communication with the other tire,
  (3) first fill means communicating with the first passage,
  (4) second fill means communicating with the second passage,
  (5) electronic assembly means having a combination of a control unit, two pressure sensors, radio frequency signal transmitter, antenna, and power supply mounted on a print circuit board, and
  (6) mounting means securing said electronic assembly with said pressure sensors pressed against respective passage opening to form an airtight mating, such that each pressure sensor through said respective passage adapted to expose directly to air pressure in the respective tire;
(B) remote radio signal reception means for receiving and displaying tire pressure data and alerts transmitted by said tire monitoring module.

10. A tire pressure monitor integrated tire inflation airflow controller, comprising:
(A) tire pressure monitor means installing on each tire and sending out wireless signals containing tire pressure data;
(B) warning light means installing on driver observable trailer body for alerting low tire pressure condition;
(C) solenoid valve means adapted to fit inline on a tire inflation system controller assembly output air delivery line for permitting and shutting off airflow in said air delivery line;
(D) central control means having in combination:
  (1) wireless signal reception means receiving tire pressure data transmitted by said tire pressure monitor,
  (2) external device interface means interfacing to said solenoid valve and warning light, and
  (3) tire inflation airflow control means having,
    (a) low tire pressure processing means determining low tire pressure condition and switching to open said solenoid valve for permitting airflow, and turning on said warning light, and
    (b) normal tire pressure processing means determining normal pressure condition and switching to close said solenoid valve for shutting off airflow, and turning off said warning light.

11. The solenoid valve of claim 10, alternatively adapted to fit inline on the air supply line from a trailer air tank output port to a tire inflation system controller input port.

* * * * *